United States Patent
Khusnatdinov et al.

(10) Patent No.: US 10,211,051 B2
(45) Date of Patent: Feb. 19, 2019

(54) METHOD OF REVERSE TONE PATTERNING

(71) Applicant: CANON KABUSHIKI KAISHA, Tokyo (JP)

(72) Inventors: Niyaz Khusnatdinov, Round Rock, TX (US); Dwayne L. LaBrake, Cedar Park, TX (US)

(73) Assignee: CANON KABUSHIKI KAISHA (JP)

( * ) Notice: Subject to any disclaimer, the term of this patent is extended or adjusted under 35 U.S.C. 154(b) by 12 days.

(21) Appl. No.: 15/336,909

(22) Filed: Oct. 28, 2016

(65) Prior Publication Data

US 2017/0140921 A1  May 18, 2017

Related U.S. Application Data

(60) Provisional application No. 62/254,891, filed on Nov. 13, 2015.

(51) Int. Cl.

| H01L 21/28 | (2006.01) |
|---|---|
| H01L 21/3065 | (2006.01) |
| H01L 21/768 | (2006.01) |
| B81C 1/00 | (2006.01) |
| H01L 21/027 | (2006.01) |
| H01L 21/306 | (2006.01) |
| H01L 21/308 | (2006.01) |
| H01L 21/311 | (2006.01) |

(52) U.S. Cl.
CPC ...... *H01L 21/0273* (2013.01); *B81C 1/00611* (2013.01); *H01L 21/28194* (2013.01); *H01L 21/3081* (2013.01); *H01L 21/3085* (2013.01); *H01L 21/3086* (2013.01); *H01L 21/30604* (2013.01); *H01L 21/30655* (2013.01); *H01L 21/7684* (2013.01); *B81C 2201/0118* (2013.01); *B81C 2201/0121* (2013.01); *B81C 2201/0126* (2013.01); *H01L 21/31116* (2013.01); *H01L 21/31138* (2013.01)

(58) Field of Classification Search
None
See application file for complete search history.

(56) References Cited

U.S. PATENT DOCUMENTS

| 6,194,287 B1 | 2/2001 | Jang |
|---|---|---|
| 6,391,792 B1 | 5/2002 | Jang et al. |
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |

(Continued)

FOREIGN PATENT DOCUMENTS

| JP | 2005-043420 A1 | 2/2005 |
|---|---|---|
| WO | WO/2015/103232 A1 | 7/2015 |

OTHER PUBLICATIONS

JP 2005-043420 English Language Abstract, espacenet.com, downloaded Sep. 27, 2017, 2 pages.

*Primary Examiner* — Stephanie P Duclair
(74) *Attorney, Agent, or Firm* — Daniel Ratoff

(57) ABSTRACT

Methods of reversing the tone of a pattern having non-uniformly sized features. The methods include depositing a highly conformal hard mask layer over the patterned layer with a non-planar protective coating and etch schemes for minimizing critical dimension variations.

20 Claims, 7 Drawing Sheets

(56) References Cited

U.S. PATENT DOCUMENTS

| | | | |
|---|---|---|---|
| 7,179,396 B2 | 2/2007 | Sreenivasan | |
| 7,205,244 B2 | 4/2007 | Stacey et al. | |
| 7,256,131 B2 | 8/2007 | LaBrake | |
| 7,396,475 B2 | 7/2008 | Sreenivasan | |
| 7,572,572 B2 | 8/2009 | Wells | |
| 7,642,101 B2 | 1/2010 | Liu et al. | |
| 7,972,959 B2 | 7/2011 | Mebarki et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,361,371 B2 | 1/2013 | Khusnatdinov et al. | |
| 8,377,631 B2 | 2/2013 | Allen et al. | |
| 8,557,351 B2 | 10/2013 | Xu | |
| 9,514,950 B2 | 12/2016 | Ye et al. | |
| 2005/0227017 A1* | 10/2005 | Senzaki | C07F 7/025 427/459 |
| 2006/0060557 A1* | 3/2006 | Sreenivasan | B29C 43/021 216/11 |
| 2007/0017899 A1* | 1/2007 | LaBrake | H01L 21/0271 216/72 |
| 2007/0077763 A1* | 4/2007 | Xu | B82Y 10/00 438/689 |
| 2009/0166317 A1* | 7/2009 | Okushima | B82Y 10/00 216/11 |
| 2011/0254139 A1* | 10/2011 | Choi | H01L 21/31053 257/632 |
| 2015/0187590 A1 | 7/2015 | Ye et al. | |

\* cited by examiner

METHOD OF REVERSE TONE PATTERNING

CROSS-REFERENCE TO RELATED APPLICATIONS

This application claims the benefit under 35 U.S.C. § 119(e)(1) of U.S. Provisional No. 62/254,891 filed on Nov. 13, 2015, which is incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Exemplary nanoimprint lithography processes are described in detail in numerous publications, such as U.S. Pat. No. 8,349,241, U.S. Pat. No. 8,066,930, and U.S. Pat. No. 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

An additional nanoimprint lithography technique involves forming a planarized layer over the previously solidified patterned layer and then subjecting the substrate, the solidified patterned layer, and the planarized layer to additional process to transfer a relief image into the substrate the corresponds to the inverse or reverse of the solidified layer pattern. Such processes have become increasingly important in nanoimprint lithography, as well as in other lithography processes, that are used in integrated device fabrication. However, difficulties in achieving adequate planarization of planarized layer while retaining adequate etch selectivity have limited the effectiveness of such processes, especially when pattern features with critical dimensions of 20 nm and below are required.

SUMMARY OF INVENTION

The present invention provides for methods for creating a relief pattern that is the inverse or reverse of an original relief pattern, including original relief patterns having non-uniformly-sized features. In one aspect of the invention, the method includes depositing a conformal hard mask layer by low temperature deposition (e.g., by atomic layer deposition (ALD)) over an originally-patterned layer followed by applying a non-planar protective layer over the conformal layer. In various aspects of the invention, the degree of non-planarity can be less than 95% or 90% or 80% or 70% or 60%, or in some cases even less than 50% or 40% or 30% planar. In further aspects of the invention, etch rates of the protective layer, conformal layer, and patterned layer can all be selected to enhance critical dimension (CD) uniformity (i.e., minimize CD variability) of the reversed features. In certain aspects, the protective layer has an etch rate selectivity $\xi_1 > 5$ as to the conformal layer, the conformal layer has an etch selectivity $\xi_2 > 1$ as to the protective layer, and the patterned layer has an etch selectivity $\xi_3 > 5$ as to the conformal layer, under respective etch process conditions. In a particular aspect, the conformal layer is silicon oxide, $SiO_2$, or aluminum oxide, $Al_2O_3$ and the non-planar protective layer is spin-on-glass (SOG).

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
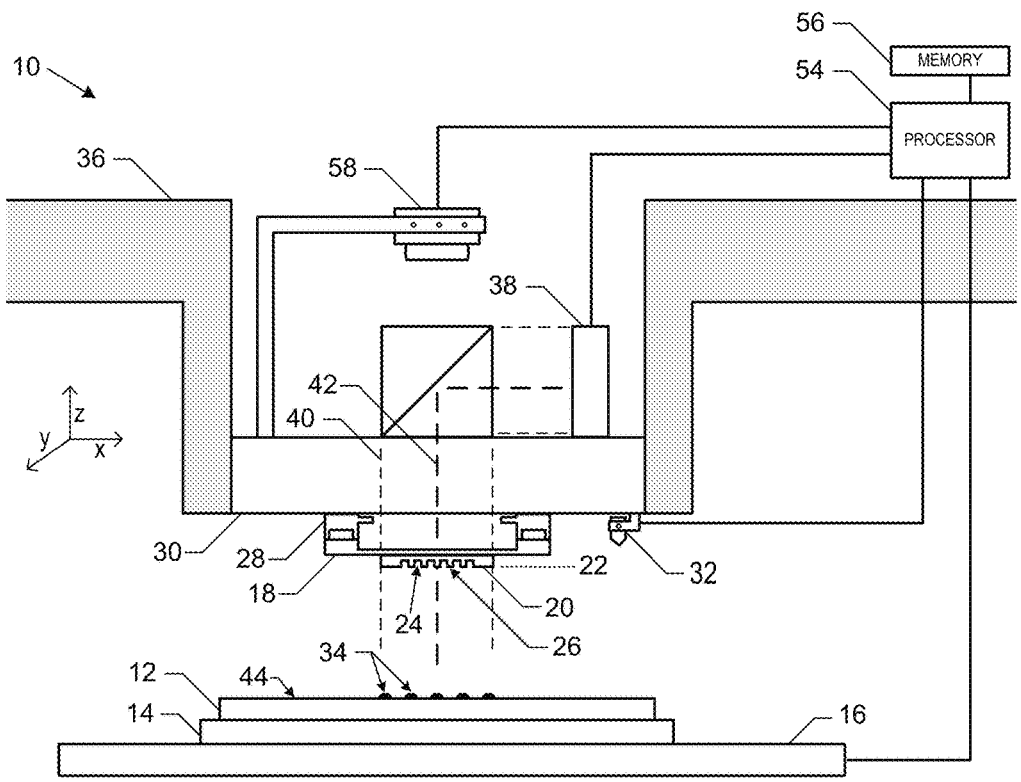
FIG. 1 illustrates a simplified side view of a nanoimprint lithography system having a template and a mold spaced apart from a substrate.

Referring to the figures, and particularly to FIG. 1, illustrated therein is nanoimprint lithography system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. No. 7,157,036 and U.S. Pat. No. 8,076,386, both of which are herein incorporated by reference.

Figure 2:
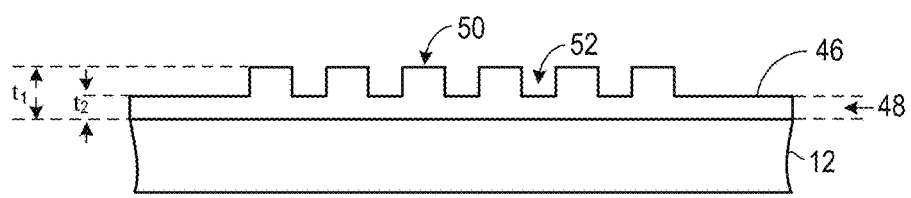
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, source 38, and/or camera 58 and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Additional nanoimprint lithography techniques involve, in particular, formation of a planarized layer over the formed patterned layer, in order to transfer a relief image into the substrate the corresponds to an inverted or reversed pattern of the original relief pattern of the formed patterned layer. A process that results in creating such an inverted or reversed-pattern in the substrate is sometimes known as or referred to as a "reverse tone" process. Reverse tone processes have become increasingly important in nanoimprint lithography, as well as in other lithography processes. However, difficulties in achieving adequate planarization while also retaining adequate etch selectivity relative to the underlying patterned layer have limited the effectiveness of reverse tone processes that require planarized layers, especially when underlying pattern features have critical dimensions (or CDs) of 20 nm and below.

Figure 3:
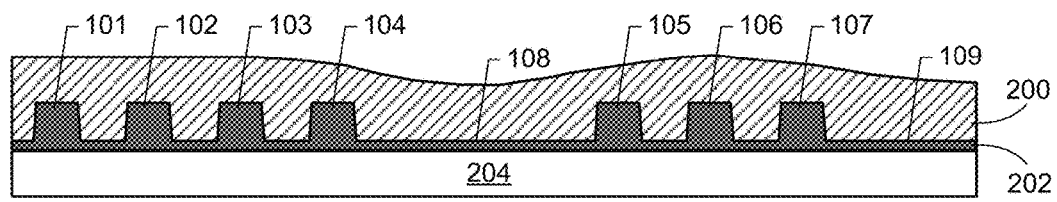
FIGS. 3-6 illustrate a simplified cross-sectional view of a reverse tone process.

The difficulties in selecting an effective planarizing material and achieving a planar layer using such material are particularly acute when the original relief pattern contains non-uniformly sized features, i.e., patterns including both small and large features. Depending on the properties of the planarizing material, its thickness, and the technique used to deposit the layer there is a characteristic spatial parameter, sp, which is used for characterization of the planarization effectiveness depending on the feature size. For example, in case of 300 nm spin-on-carbon (SOC) material deposited by spin-on technique the characteristic spatial parameter sp~1 micron. As used herein, "small" features refer to features having a lateral size, s, in at least in one in-plane direction that less than 1 um (i.e., s<1 um), whereas "large" features refer to features having lateral sizes in both in-plane dimensions, s1 and s2, that are at least 1 um (i.e., s1, s2≥1 um). As further used herein, the term features includes features that protrude or extend from the pattern as well as recesses or open areas within the pattern. For example, a 20 nm/20 nm line/space periodic pattern represents a set of equally spaced small features, whereas an open (i.e., free of any other features inside) square area of 15 um×15 um, or a rectangular open area 10 um×60 um are considered large features. An example of a pattern of non-uniformly sized features, includes a pattern having two groups or areas of 50 nm/50 nm lines/spaces (small features) which are spaced apart by a 5 um gap or open area (a large feature). FIG. 3 illustrates a typical difficulty associated with such scenario. Patterned layer 202 (not to scale) is formed over substrate 204 and contains small features 101, 102, 103, 104, 105, 106, and 107, with features 101, 102, 103 and 104 separated from features 105, 106, and 107 by open area 108, and with open area 109 similarly extending beyond feature. Here open areas 108 and 109 can each be considered as a large feature relative to features 101, 102, 103, 104, 105, 106, and 107 such that features 104, 105 and 107 in particular can be considered to be located at the transition zone between small and large features. Layer 200 is formed overtop patterned layer 202 as a planarizing layer. However, due to practical limitations as further described herein, layer 200 is not fully planar, and instead includes formed depressions over open areas 108 and 109, such that the planarization efficiency for layer 200 is less than 100%. As further used herein, the term "planarization efficiency" is defined as $$P = \frac{(H_2 - H_1)}{H_{FH}} \quad (1)$$

where $H_{FH}$ is the original feature (or step) height, $H_1$ is the thickness of the planarizing material overtop the feature (or step), and $H_2$ is the thickness of the planarizing material at the bottom of the feature (e.g. in the open bottom area near the step). Thus planarization efficiency of a layer is a measure of its variability away from the ideal condition of completely 100% planar layer.

Planarization variability is, to a large part, a naturally occurring phenomenon. That is, upon application of the planarizing material (typically e.g. by spin coating), the material will resolve to the same coating thickness on all large open areas or surfaces where the effect of boundaries is minimal. To a similar extent the material will likewise resolve to the same relative thickness across large features having full feature height where boundary effects are also likewise minimal, albeit at a slight overall elevation as compared to the material coating the open areas or surfaces. Tightly-spaced small features having full feature height produce a similar effect as large full height features with an effective thickness depending on the specific duty cycle of the pattern in that place. The phenomena of thickness variations is illustrated in a simplified form in FIG. 3, with thickness variations of layer 200 seen at open areas 108 and 109, and above tightly spaced small features 101, 102, 103, 104, and 105, 106, 107.

Figure 4:
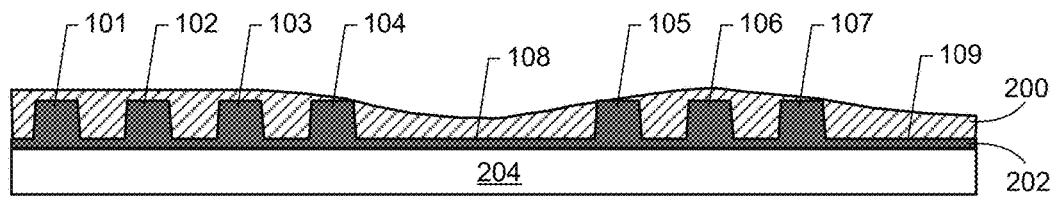
Figure 5:
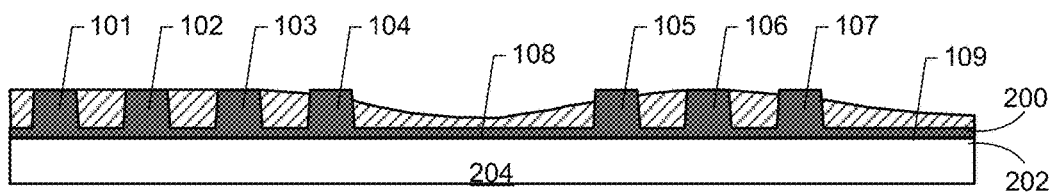
Figure 6:
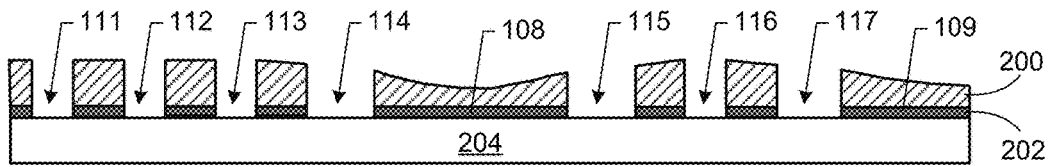
Figure 7A:
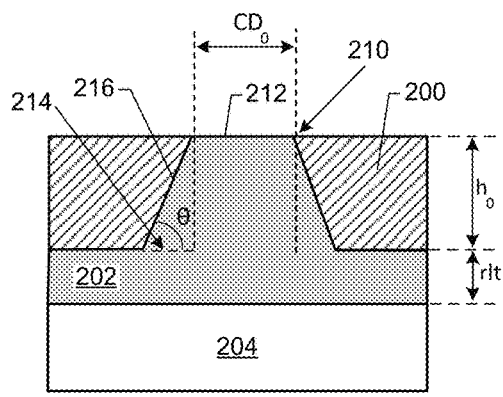
FIGS. 7A-7D illustrate a simplified cross-sectional view of critical dimension variations resulting from the process of FIGS. 3-6.
Figure 7B:
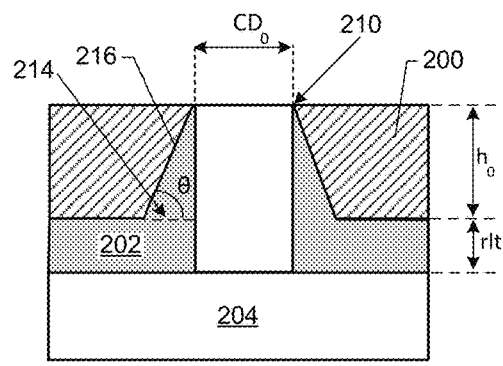
Figure 7C:
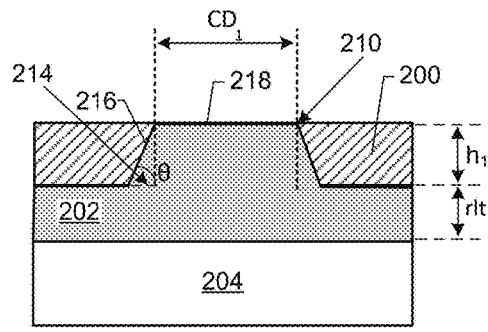
Figure 7D:
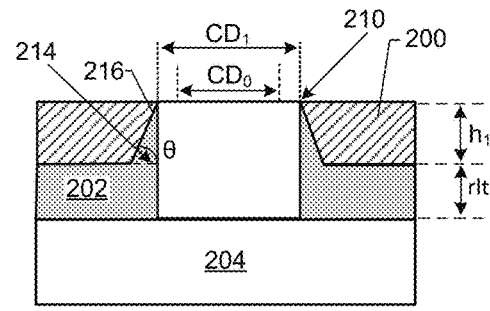

Planarization variability, in particular, produces adverse effects in transition zones where a pattern shifts from small to larger, or large to smaller features. In FIG. 3, such transition zones are located between features 104, 108, between features 108, 105, and between features 107, and 109. As another example, such transition zones can occur where there are clusters of nanometer scaled features separated by micron-sized open areas. Such transition zones tend to have different planarization profiles relative to remainder of the pattern. On further processing, this can lead to features in the transition zone having variable critical dimensions (CDs) as compared to the features inside more uniform size area. Referring to FIGS. 4-5, as layer 200 is etched back to expose the tops of features 101, 102, 103 and 106, features 104, 105 and 107 become more exposed relative to features 101, 102, 103 and 106 as a result of the variation in planarity profile at the transition zones (see FIGS. 4, 5). Then upon subsequent etching away of the exposed features (see FIG. 6), the resultant trenches 114, 115 and 117 (corresponding to features 104, 105 and 107) will have slightly larger CDs than resultant trenches 111, 112, 113, and 116 (corresponding to features 101, 102, 103 and 106) and this same undesirable CD variation will persist upon further etching of the pattern into the substrate (not shown). This phenomenon is attributable to the fact that the patterned feature sidewalls are not completely vertical (i.e., the patterned features sidewalls have slopes less than 90 degrees). This can be more clearly seen with reference to FIGS. 7A-7D. FIG. 7A depicts substrate 204 with patterned layer 202 including feature 210 extending therefrom having height $h_0$ and sidewall slope θ (less than 90°) such that the base of feature 210 is wider than its top 210. Hard mask 200 has been etched back to expose top 212 of feature 210. FIG. 7B depicts the result of a through etch of the feature and underlying residual layer (rlt) to expose substrate 204. The CD of the resultant feature when etched into the substrate will be $CD_0$, which corresponds to the width of feature 201 at its top 212. However, if hard mask 200 is initially etched back further, as shown in FIG. 7C, such that the feature 210 is reduced to height $h_1$ (with $h_1 < h_0$), then the through etch of feature 210 results in a wider $CD_1$ ($CD_1 > CD_0$), as shown in 7D. With reference to FIGS. 3-6, the same phenomena occurs in the transition zones where the planarity profile variations of layer 200 lead to a greater etch back of transition features 104, 105 and 107 which then leads to subsequent wider CDs of resultant features 114, 115, 117 as compared to resultant features 111, 112, 113, and 116 in the non-transition areas.

In addition to planarization variability, an additional difficulty in imprint reverse tone processes is achieving adequate etch selectivity of the planarization layer relative to the cured imprint resist, as the planarization layer acts as hard mask. Imprint resists are typically formed of an organic material. High etch selectivity typically requires the composition of the hard mask to be different than that of the resist. For example, a silicon-containing material such as spin-on glass (SOG) is a commonly used planarizing material and can theoretically have the etch selectivity necessary to be an effective hard mask for an organic imprint resist that is further subjected to, for example, an oxygen plasma etch. Unfortunately, the spin-on glass needs to be baked at a high temperature (~300-400° C.) for full conversion to a silicon oxide-like material that has the required high etch selectivity characteristics. But this conversion temperature is well above imprint resist transition temperatures (~80° C.), i.e., the temperature at which the imprint resist starts to melt and flow. Thus SOG is not useful as an etch mask without damaging the resist features. Conversely, if the SOG is not baked at a high enough temperature, the conversion to a silicon oxide-like material will not occur. Thus while the resist features will survive, the material will not have good enough etch selectivity to be useful for imprint reverse tone processes.

The present invention addresses these and other concerns by replacing the single planarization layer with a first conformal hard mask layer followed by a second protective layer on top of the first conformal hard mask layer. The first conformal hard mask layer preferably achieves: (1) highly conformal coating of the underlying patterned resist layer at (2) high thickness uniformity, while also having (3) high etch selectivity as to the resist in a first etch chemistry such that the first conformal hard mask etches slower than the resist, as well as (4) high etch selectivity relative to the second protection layer in a second etch recipe such that the first conformal hard mask etches slower than the second protective layer. In one embodiment, the first conformal hard mask layer is silicon oxide, $SiO_2$, which is deposited by a low temperature (~50° C.) atomic layer deposition (ALD) technique. Such a technique can deposit a highly conformal, uniform thickness $SiO_2$ layer over the patterned resist at a low temperature t~50° C., i.e., below the resist transition temperature. Other oxides, such as aluminum oxide, $Al_2O_3$, can also be deposited using a room temperature ALD process. Such ALD techniques achieve a highly conformal coating, with a uniformity thickness within one to two monolayers. Also, oxides such as $SiO_2$ and $Al_2O_3$ have very high etch selectivity to both imprint and optical resists, especially in an oxygen-based plasma etch. The terms "etch rate selectivity" and "etch selectivity" are used herein interchangeably.

The second protective layer preferably achieves (1) high etch selectivity as to the first highly conformal layer, with etch selectivity ξ1 of at least 5 (ξ1≥5) using a selected etch chemistry such that the protective layer etches slower than the first conformal layer, and (2) achieves some level of planarization efficiency, (e.g., at least 15% or 20% or 25%, or 35% or 50%), but full 100% planarization efficiency is not required (e.g., planarization efficiency can be less than 95% or 90% or 80% or 70% or 60%, or in some cases even less than 50% or 40% or 30%). In other words, the planarization efficiency is relaxed as compared to processes requiring a fully planar layer. In one embodiment, the protective layer can be a spin-on carbon layer (SOC). SOC has high etch selectivity with respect to the above oxides where the SOC etches slower than the above oxides. For example, SOC has an etch selectivity $\xi1 \geq 5$ with respect to silicon oxide, $SiO_2$, in an oxygen-based plasma etch. In another example, a protective layer can be an adhesion layer as described in U.S. Pat. No. 8,557,351 incorporated herein by reference. In another example a protective layer can be made of Level® M10 material from Brewer Science, Inc. (Rolla, Mo.).

Figure 8A:
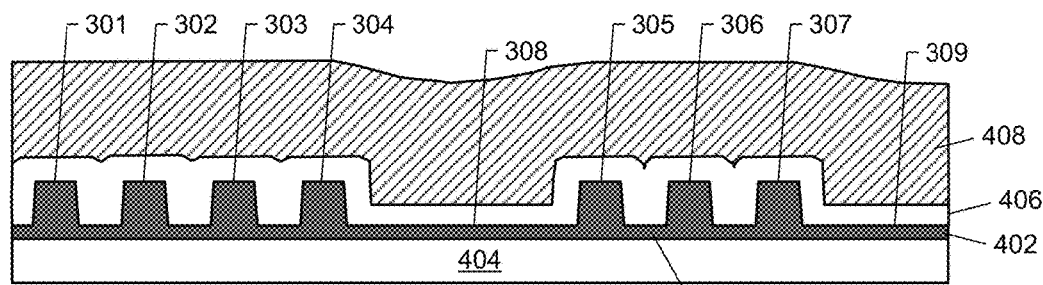
FIGS. 8A-8D illustrate a simplified cross-sectional view of a reverse tone process according to an embodiment of the invention.
Figure 8B:
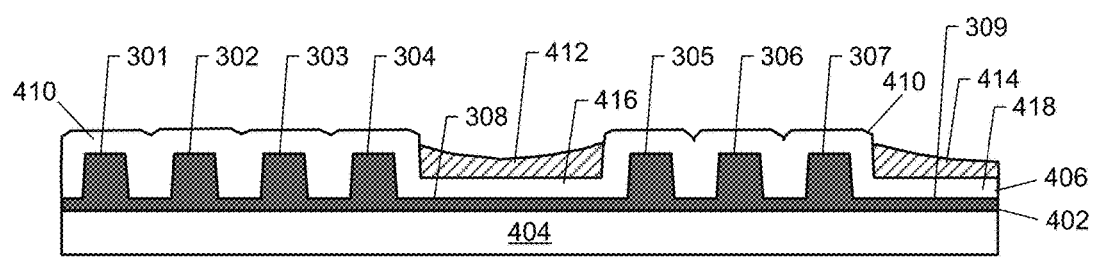
Figure 8C:
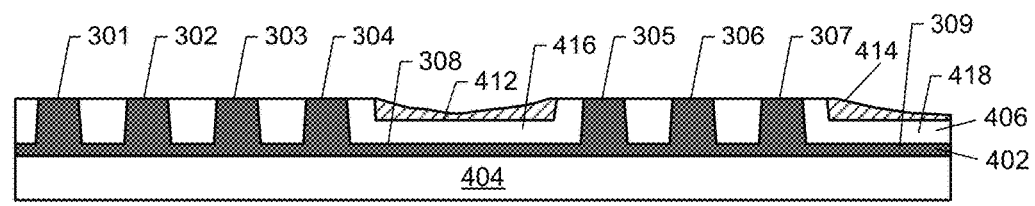
Figure 8D:
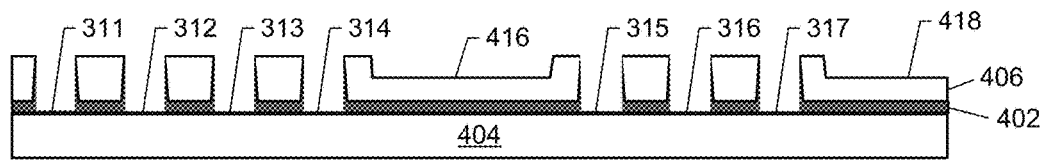

Referring to FIGS. 8A-8D, a reverse tone process according to the invention is further depicted. In FIG. 8A, patterned layer 402 is formed over substrate 404 and contains features 301, 302, 303, 304, 305, 306, and 307 extending from residual layer 310. Features 301, 302, 303 and 304 are separated from features 305, 306, and 307 by open area 308, and with open area 309 similarly extending beyond feature 307, similar to the pattern in FIG. 3. Conformal hard mask layer 406 is layered over patterned layer 402 at a uniform thickness $t_{HM}$. Protective layer 408 is layered over hard mask layer 406. Notably, protective layer 408 includes planarity variations at transition zones associated with features 304, 305 and 307, similar to the situation in FIG. 3. Turning to FIG. 8B, protective layer is etched back (FIG. 8B) to at least expose the top 410 of conformal hard mask layer that extends across the tops of features 301, 302, 303, 304, 305, 306, and 307, while portions 412 and 414 of protective layer 408 remain over open areas 308 and 309 respectively. Because of the thickness uniformity of the hard mask 406 and its high etch selectivity to protective layer 408, the top surface of that portion of hard mask 406 that extends over pattern features 301, 302, 303, 304, 305, 306, and 307 is uniformly opened and exposed across the entirety of the pattern, including across those pattern features in the transition zones, that is, pattern features 304, 306, and 307. The high uniformity of the underlying hard mask layer effectively overcomes the defectivity concerns otherwise associated with planarizing layers that are not fully planar. In a sense, the thickness variations of the protective layer are "rectified" by the top surface portions of the hard mask. Because of the high etch selectivity, the protective layer can be slightly over-etched to open all the tops of the hard mask features uniformly over the whole pattern. The remaining protective layer portions 412 and 414 can remain non-planar as their primary purpose is to protect the underlying hard mask during the next etch step. Turning to FIG. 8C, hard mask layer 406 is then etched back to expose the tops of pattern resist features 301, 302, 303, 304, 305, 306, and 307. The highly uniform thickness of the hard mask leads to highly uniform CDs of the resultant reverse tone pattern features because the etching of the hard mask starts and stops across the pattern at the same height. The sidewall slope of the features does not impact CDs because there is no variability between feature etching in the transition zones vs. non-transition zones; instead, all features have consistent and uniform CDs, as further shown in FIG. 8D. In FIG. 8D, the pattern features and underlying residual layer have been etched away (as has remaining protective layer portions 412 and 414) resulting in corresponding trenches (311, 312, 313, 314, 315, 316, and 317) that have highly uniform CDs. Further, the etch selectivity of resist used to form the resist features to the conformal hard mask in a specific etch recipe can be denoted $\xi3$. For example, a typical imprint resist has an etch selectivity $\xi3 \geq 5$ with respect to silicon oxide, $SiO_2$, in an oxygen-based plasma etch. The CD uniformity of the obtained similar size features, CDU1, has contribution from CD uniformity of the original resist features, CDU0; protection layer thickness uniformity, PLU; and, in the case of an imprinted pattern, the residual layer thickness uniformity of the resist under the features, RLTU, and is described by the following equation:

$$CDU1^2 \sim CDU0^2 + A\frac{PLU^2}{(\xi_1)^2} + A\frac{RTLU^2}{(\xi_3)^2} \qquad (2)$$

where coefficient A depends on side wall slope of the original resist features. If both etch selectivities $\xi1$ and $\xi3$ are maximized, the contributions of protective layer thickness uniformity, PLU, and residual layer thickness uniformity, RLTU, (in the case of an imprinted pattern) to the resulted feature CD uniformity, CDU1, are minimized. For instance, if $\xi1=10$, and $\xi3=10$, the contribution of PLU and RLTU to $(CDU1)^2$ will be 100 times smaller compared to the etch processes with no etch rate selectivity between the materials, i.e. $\xi1=1$, $\xi3=1$. Thus the reverse tone features of similar sizes will have highly uniform CDs. Note that in the case of patterned resist with no residual layer the term with RLTU in equation (2) is omitted. Thus in FIG. 8D, when the structure is subjected to further etching into substrate 404, the result is an inverse (reverse tone) of the original pattern with highly uniform CDs, regardless of whether or not the respective original pattern features were located in transition zones.

Figure 9A:
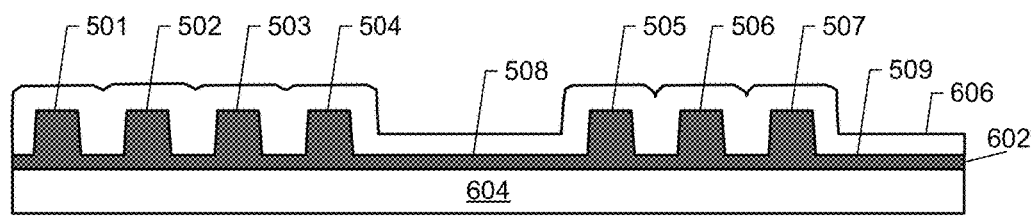
FIGS. 9A-9C illustrate a simplified cross-sectional view of a different type of lithographic process.
Figure 9B:
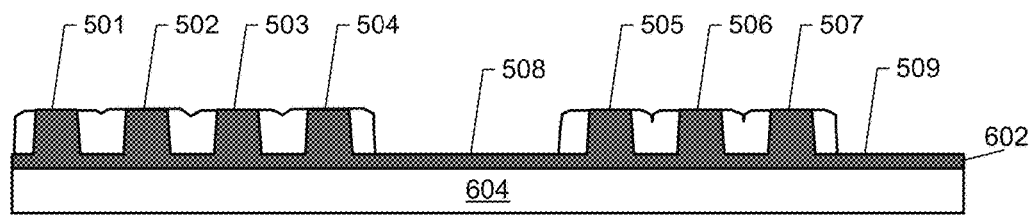
Figure 9C:
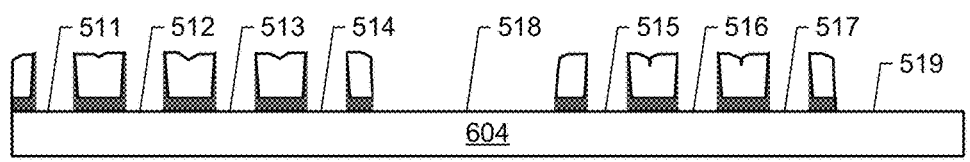

FIGS. 9A-9C further illustrate the importance of the protective layer to the reverse tone processes according to the present invention. FIG. 9A depicts a conformal hard mask layer 606 deposited over patterned layer 602, similar to hard mask layer 406 as shown in FIG. 8A but without added protective layer 408. FIG. 9B depicts an etch back of hard mask layer 606 to expose the tops of features 501, 502, 503, 504, 505, 506 and 507, but such an etch back of the hard mask layer along tops of these features also removes the hard mask layer at open features 508 and 509. These features 508 and 509 thus are lost upon further reverse tone processing steps, as shown in FIG. 9C. That is, with mask layer 606 etched back at open features 508 and 509 such that features 508 and 509 are no longer protected, the subsequent etching of patterned layer 602 will not generate an inverse (or reverse tone) pattern of open features 508 and 509 into substrate 604. In other words, the pattern tone is not fully inverted or reversed.

Figure 10A:
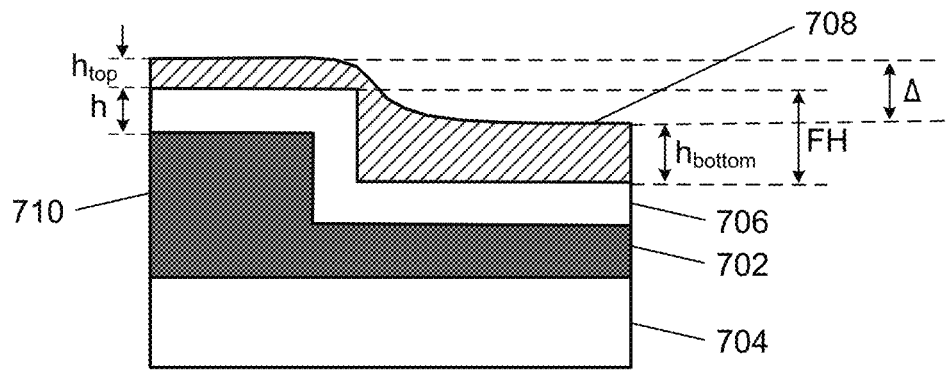
FIG. 10A-10C illustrate a schematic cross-sectional view of a process according to an embodiment of the invention.
Figure 10B:
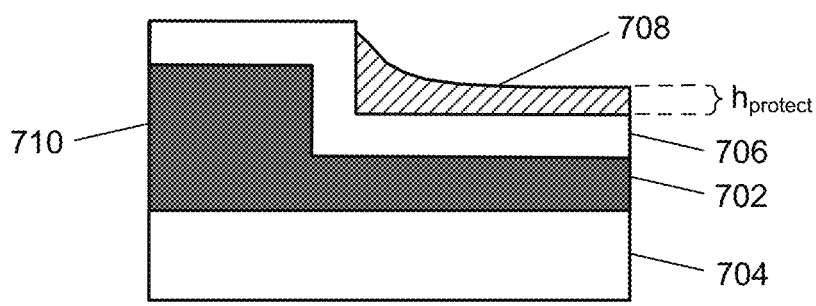
Figure 10C:
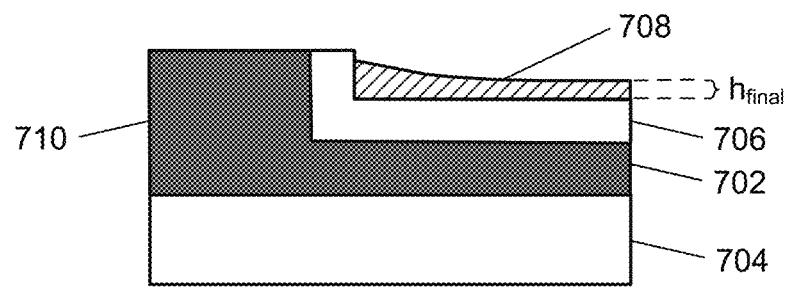

With reference to FIGS. 10A-10C, the minimum planarization efficiency of the protective layer under given parameters, including given etch selectivity of hard mask relative to the protective layer material, can be determined. FIG. 10A depicts substrate 704 with patterned layer 702 having feature 710 formed thereon, with hard mask layer 706 formed over patterned layer 702, e.g., by $SiO_2$ atomic layer deposition (ALD) to conformally pattern layer 702 with a uniform layer thickness, $h_{HM}$. Feature 710 provides for a feature that determines a height step in the hard mask layer denoted as FH. Protective layer 708 is applied over hard mask layer 706, e.g., by spin-on process. The thickness of protective layer 708 on top of feature 710 area is denoted as $h_{top}$, with the thickness of protective layer at the bottom the step, i.e., adjacent to feature 710, denoted as $h_{bottom}$. The corresponding height step established in protective layer 708 is denoted as Δ. The planarization efficiency, PE, according to equation (3) is thus expressed as:

$$PE = \frac{(h_{bottom} - h_{top})}{FH} = 1 - \frac{\Delta}{FH} \quad (3)$$

Turning to FIG. 10B, protection layer 708 has been etched back to expose the portion of hard mask layer 706 covering the top of feature 710, with the thickness of protective layer 708 at the bottom of the step reduced to thickness $h_{protect}$. With reference to FIG. 10C, hard mask 706 is then etched away to reveal feature 710 of patterned layer 702, with protective layer 708 further reduced to $h_{final}$. For a given etch selectivity, ξ2, of the hard mask material to the protective layer material, then for a given thickness, $h_{HME}$, of hard mask layer 706 that is etched away, the protective layer 708 will correspondingly be etched away a thickness $h_{HME}$/ξ2. In general, the hard mask can be subjected to etch condition that will remove a thickness, $h_{HME}$, that is more or less than the actual hard mask thickness, $h_{HM}$. The change in protection layer 708 thickness during the hard mask etch is:

$$h_{protect} - h_{final} = \frac{h_{HME}}{\xi 2} \quad (4)$$

If the hard mask etch is stopped when the top of feature 710 is first exposed, then:

$$h_{HME} = h_{HM} \quad (5)$$

Thus for a given etch selectivity, ξ2, the minimum required thickness of protection layer 708 to protect the underlying hard mask at a specific location is a thickness such that when feature 710 is first exposed, i.e. $h_{HME} = h_{HM}$, the final thickness, $h_{final}$, of protection layer in the specific location is approaching zero. This can be expressed as:

$$h_{protect\_min\_local} = \frac{h_{HM}}{\xi 2} \quad (6)$$

where the minimal protective layer thickness is denoted $h_{protect\_min\_local}$.

The effective minimum required thickness of protection layer 708 is further dependent upon two additional variables, the total or global thickness variation of the protective layer across the entirety of a substrate (e.g., wafer), denoted as $\Delta h_{protect\_global}$, and the global feature height variation across the entirety of the patterned layer, denoted as $\Delta FH_{global}$. Taking these variable into consideration, the required maximum global thickness of the protection layer across the entirety of the substrate or wafer, denoted $h_{protect\_max\_global}$, can be expressed as:

$$h_{protect\_max\_global} = \frac{h_{HM}}{\xi 2} + \Delta h_{protect\_global} + \Delta FH_{global} \quad (7)$$

From here, the minimum planarization efficiency, or $PE_{min}$, for the protective layer can be expressed as:

$$PE_{min} = \frac{h_{protect\_max\_global}}{FH} \quad (8)$$

$$PE_{min} = \frac{1}{FH}\left(\frac{h_{HM}}{\xi 2} + \Delta h_{protect\_global} + \Delta FH_{global}\right) \quad (9)$$

In other words, the minimum planarization efficiency, PE, for a given protective layer is dependent upon the etch selectivity, ξ2, feature height, FH, hard mask thickness, $h_{HM}$, and the global protective layer thickness variation and global feature height variation, $\Delta h_{protect\_global}$ and $\Delta FH_{global}$. For a given hard mask thickness to be etched away, $h_{HME}$, the minimum planarization efficiency for the protective layer can be expressed by the following equation:

$$PE_{min} = \frac{1}{FH}\left(\frac{h_{HME}}{\xi 2} + \Delta h_{protect\_global} + \Delta FH_{global}\right) \quad (10)$$

where the minimum etch thickness of the hard mask, $h_{HM}$, is replaced by the required thickness etch of the hard mask, $h_{HME}$.

Figure 11:
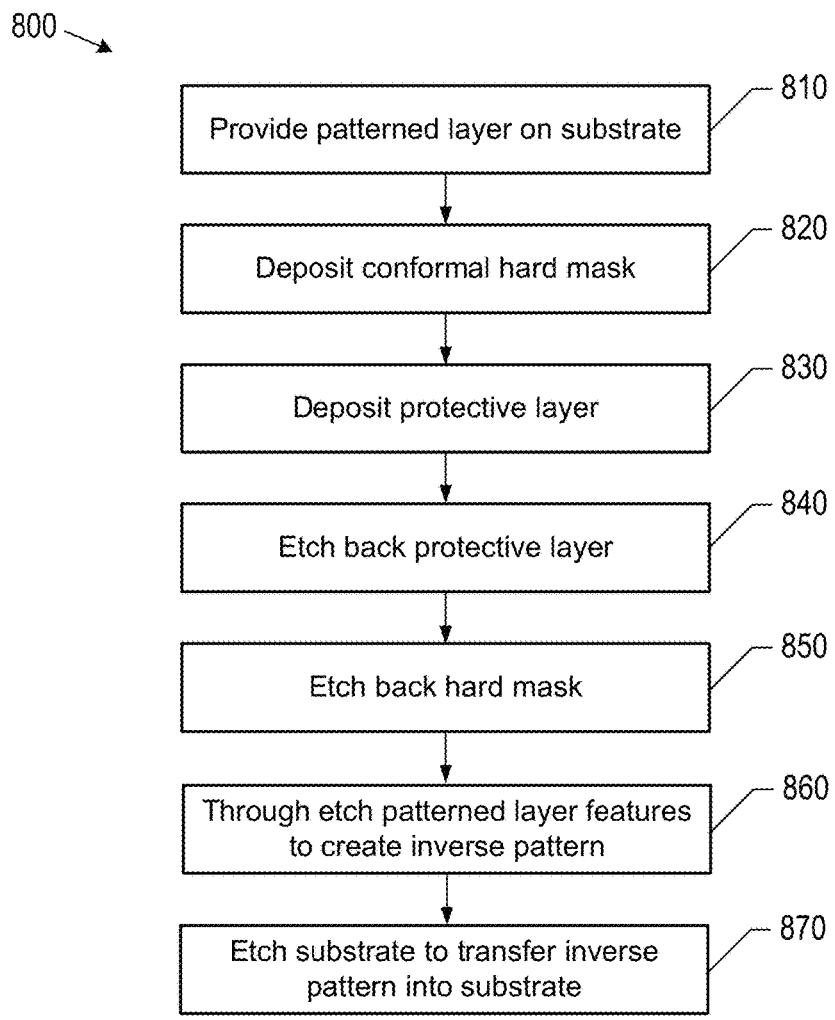
FIG. 11 illustrates a reverse tone process flow according to an embodiment of the invention.

Referring now to FIG. 11, process 800 depicts a work flow process that encompasses aspects of the invention. In step 810, a patterned resist layer is formed on a substrate (or other underlying layer). This can be accomplished through known lithography techniques, including, but not limited to, optical and imprint lithography techniques. In step 820, a conformal hard mask layer is deposited on the patterned resist layer at room or low temperature, i.e., at a temperature below the resist transition temperature. The conformal hard mask layer should be highly conformal and have a highly uniform thickness, preferably with less than 5 nm thickness variability. The conformal hard mask layer should also have a high etch selectivity to the resist. For example, silicon oxide, $SiO_2$, or aluminum oxide, $Al_2O_3$, deposited by low temperature atomic layer deposition (ALD) techniques can achieve such requirements. To achieve the highest CD uniformity for the smallest features, it is further preferable to set the conformal layer thickness to a thickness that is larger than one-half of the smallest pitch size of the patterned layer features (i.e., thickness t>0.5 smallest feature pitch p). In step 830 a protective layer is formed over the conformal hard mask layer by known techniques, including but not limited to spin-on processes. The protection layer should have a high etch selectivity to the conformal hard mask layer, e.g., etch selectivity ξ1≥5, in a first selected etch chemistry where the conformal hard mask layer etches slower than the protective layer. For example, a protective layer of spin-on-carbon (SOC) over a hard mask layer of $SiO_2$ has the requisite etch selectivity in an oxygen-based etch process. The protective layer and conformal hard mask layer pair should also be selected such that the protective layer likewise has an etch selectivity to the conformal hard mask layer, e.g., etch selectivity ξ2>1, in a second selected etch chemistry where the protective layer etches slower than the conformal hard mask. In the same SOC protective layer and $SiO_2$ hard mask layer example, the $SiO_2$ has the requisite etch selectivity as to SOC in a plasma etch using a $CF_4$/$CHF_3$ mixture. The protective layer must also be applied so as to achieve a requisite minimum planarization efficiency, $PE_{min}$ (see equation (9) herein), although complete planarization (100%) of the protective layer is not required, as previously indicated. For example, an SOC protective layer can be formed by a spin-on process with a PE=50%, which corresponds to variations in the protection layer thickness of one-half the feature height, FH, of the patterned layer.

Once the protective layer has been applied, etch steps 840, 850, 860 and 870 are performed to generate an inverse pattern (reverse tone) of the patterned layer into the substrate. In step 840, the protective layer is etched back until the tops of the hard mask features are opened uniformly over the entirety of the substrate (whole wafer). A slight over-etching of the protective layer is acceptable if necessary to open all the hard mask features. As previously noted, for a SOC protective layer on top of silicon oxide SiO2 hard mask layer, the requisite high etch selectivity, $\xi 1 \geq 5$, exists for an oxygen-based etch process. In step 850, the tops of the hard mask features are etched away until the tops of the resist features are opened. Here also a slight over-etch may be required until all the patterned resist layer features over the entirety of the substrate (whole wafer) are opened to the required level (height). In some cases the features can be opened to ~0.7 level (height) of the full resist feature height. High etch selectivity, $\xi 2$, of protective layer to hard mask layer is also required here, such that the protection layer shields the hard mask from being etched away at open spaces extending between features or feature clusters. The protection layer here etches slower than the hard mask. As previously noted, for a $SiO_2$ hard mask layer and a SOC protective layer, the requisite etch selectivity exists for a plasma etch using a fluorine-based chemistry, e.g., $C_4F_8$, $CF_4$, $CHF_3$ or a mixture thereof. In step 860, the patterned resist is then etched through using a highly anisotropic etch process to vertically etch away the resist and maintain the feature critical dimensions (CDs), as defined by hard mask opening cross-sections, under high control. High etch selectivity, $\xi 3$, of hard mask to resist, e.g., $\xi 3 \geq 5$, is required. In this case the hard mask etches slower than the resist. For example, when using an organic imprint resist and silicon oxide, $SiO_2$, as the hard mask, the requisite etch selectivity is achieved in a plasma etch using e.g. oxygen, oxygen/argon, and/or an oxygen/helium gas mixture. Finally, in step 870 the substrate (or other underlying layer) is etched to transfer a reverse tone (inverse pattern) of the original pattern into the substrate, with highly uniform feature CDs. The etch requirement here depends on the hard mask material, e.g., $SiO_2$, and on the substrate e.g., Si, or other underlying material, e.g., another SOC layer.

EXAMPLES

In the following examples, silicon wafer substrates are patterned by imprint lithography techniques, with the resultant patterned layers having differing global feature height variations, $\Delta FH_{global}$. Patterned layers are then coated with $SiO_2$ conformal hard mask layer, with the $SiO_2$ deposited on the patterned layers by ALD technique to varying thicknesses, $h_{HM}$. A spin-on carbon (SOC) protection layer is then deposited over the hard mask layer by spin-on process to an average thickness of 300 nm, with the protection layer having varying global thickness variations, $\Delta h_{protect\_global}$. Etch selectivities, $\xi 2$, are likewise varied.

Example 1

In a first example, the hard mask layer thickness that is etched away $h_{HME}=20$ nm; the etch selectivity $\xi 2=5$; the global variations of the protection layer thickness above the same type of feature, $\Delta h_{protect\_global}=3$ nm, and global variations of the feature height, $\Delta FH_{global}=2$ nm, and the feature height, FH=40 nm. From here, equation (10) above becomes:

$$PE_{min}=\frac{1}{40}(20/5+3+2)=0.225=22.5\% \quad (11)$$

Thus with the above parameters, the minimum planarization efficiency of 22.5% for the protective layer is adequate to safely and completely reverse the pattern tone. Table 1 below shows $PE_{min}$ values for the above given parameters but with different etch rates.

TABLE 1

Relation between given etch selectivity, $\xi 2$, and the required minimum planarization efficiency according to equation (10) with remaining parameters constant.

| $\xi 2$ | $PE_{min}$, % |
|---|---|
| 20 | 15 |
| 10 | 17.5 |
| 6 | 20.8 |
| 5 | 22.5 |
| 4 | 25 |
| 3 | 29.2 |
| 2 | 37.5 |
| 1 | 62.5 |

As shown, if the etch rate selectivity is very high, e.g., $\xi 2=10$, the minimum planarization efficiency can be fairly low, e.g., $PE_{min}=17.5\%$. And vice versa, if the planarization efficiency is fairly high (but not still not fully planar), e.g., $PE_{min}=62.5\%$, the etch rate selectivity can fairly low, e.g., $\xi 2=1$.

Example 2

In this example, the variables remain the same as in Example 1 with the exception that the global variation of the protection layer thickness is increased to $\Delta h_{protect\_global}=10$ nm. From here equation (10) above becomes:

$$PE_{min}=\frac{1}{40}(20/5+10+2)=0.4=40\% \quad (12)$$

Here, given the above parameters and chosen etch selectivity $\xi 2=5$, the minimum planarization efficiency of 40% is enough to for the protective layer to safely and completely reverse the pattern tone. However, it can also be seen that non-ideal spin-on protection layer thickness variations of 10 nm are causing more stringent requirements for planarization efficiency. For $\xi 2=5$, the minimum planarization efficiency is increased from 22.5% for $\Delta h_{protect\_global}=3$ nm (in Example 1) to 40% for $\Delta h_{protect\_global}=10$ nm in this example. Table 2 below shows $PE_{min}$ values for the above given parameters but with different associated etch rate selectivity.

TABLE 2

Example 2 relation between given etch selectivity, $\xi 2$, and the required minimum planarization efficiency remaining parameters constant

| $\xi 2$ | $PE_{min}$, % |
|---|---|
| 20 | 32.5 |
| 10 | 35 |
| 6 | 38.3 |
| 5 | 40 |
| 4 | 42.5 |
| 3 | 46.7 |
| 2 | 55 |
| 1 | 80 |

Example 3

In this example, the variables remain the same as in Example 1 with the exception that hard mask thickness is increased to $h_{HME}=30$ nm. From here equation (10) above becomes:

$$PE_{min}=\tfrac{1}{40}(\tfrac{30}{5}+3+2)=0.275=27.5\% \quad (13)$$

Here, given the above parameters and chosen etch selectivity $\xi 2=5$, the minimum planarization efficiency of 27.5% is enough to for the protective layer to safely and completely reverse the pattern tone. It is apparent that increased thickness of the hard mask (i.e., increased etch depth of the hard mask) causes more stringent requirements for minimum planarization efficiency. For $\xi 2=5$ the minimum planarization efficiency is increased from 22.5% for $h_{HME}=20$ nm (Example 1) to 27.5% for $h_{HME}=30$ nm in this example. Table 3 shows $PE_{min}$ values for the above given parameters but with different associated etch rate selectivity.

TABLE 3

Example 3 relation between given etch selectivity, $\xi 2$, and the required minimum planarization efficiency with remaining parameters constant.

| $\xi 2$ | $PE_{min}$, % |
| --- | --- |
| 20 | 16.3 |
| 10 | 20 |
| 6 | 25 |
| 5 | 27.5 |
| 4 | 31.3 |
| 3 | 37.5 |
| 2 | 50 |
| 1 | 87.5 |

Example 4

In this example, the variables remain the same as in Example 1 with the exception that the global variation of the protection layer thickness is increased to $\Delta h_{protect\_global}=10$ nm as in Example 2 and the hard mask thickness is increased to $h_{HME}=30$ nm as in Example 3. From here equation (10) above becomes:

$$PE_{min}=\tfrac{1}{40}(\tfrac{30}{5}+10+2)=0.45=45\% \quad (14)$$

For the four chosen here parameters used in equation 10, and chosen etch selectivity $\xi 2=5$, the minimum planarization efficiency of 45% is enough safely and completely reverse the pattern tone. Here it is apparent that the increased thickness of the hard mask (or increased etch depth of the hard mask), and simultaneous degradation in spin-on film uniformity cause more stringent requirements for minimum planarization efficiency. For $\xi 2=5$, the planarization efficiency is increased to 45%. Table 4 shows $PE_{min}$ values for the above given parameters but with different associated etch rate selectivity. Here, for very low etch selectivity, e.g. $\xi 2=1$, there is no acceptable solution.

TABLE 4

Example 4 relation between given etch selectivity, $\xi 2$, and the required minimum planarization efficiency with remaining parameters constant.

| $\xi 2$ | $PE_{min}$, % |
| --- | --- |
| 20 | 33.8 |
| 10 | 37.5 |
| 6 | 42.5 |
| 5 | 45 |
| 4 | 48.8 |
| 3 | 55 |
| 2 | 67.5 |
| 1 | 105 (not achievable) |

Example 5

In this example, the variables remain the same as in Example 2 with the exception that the feature height is increased to FH=60 nm. From here equation (10) above becomes:

$$PE_{min}=\tfrac{1}{60}(\tfrac{20}{5}+10+2)=0.267=26.7\% \quad (15)$$

Example 5 uses parameters from Example 2 plus increased feature height from 40 nm to 60 nm. For etch selectivity $\xi 2=5$, the minimum planarization efficiency of 26.7% is enough to safely and completely reverse the pattern tone. Table 5 shows $PE_{min}$ values for a range of different etch rate selectivity. It is apparent that increased feature height relaxes the requirements for the minimum planarization efficiency (compare to Table 2). For instance, for $\xi 2=5$ the planarization efficiency requirement is down to 26.5% from 40% in Example 2.

TABLE 5

Example 5 relation between given etch selectivity, $\xi 2$, and the required minimum planarization efficiency with remaining parameters constant.

| $\xi 2$ | $PE_{min}$, % |
| --- | --- |
| 20 | 21.7 |
| 10 | 23.3 |
| 6 | 25.6 |
| 5 | 26.7 |
| 4 | 28.3 |
| 3 | 31.1 |
| 2 | 36.7 |
| 1 | 53.3 |

Example 6

In this example, the formed patterned layer consisted of the smallest features being 30 nm line/space with 1:1 duty cycle pattern, with large open areas between the features as large as 30 microns. The feature height for all the features, FH, was 57 nm. Feature height variations on the template (and thus the resulting patterned layer) were $\Delta FH_{global}=2$ nm. The hard mask layer was $SiO_2$ layer deposited by ALD technique. The hard mask thickness was $h_{HM}=20$ nm. A spin-on carbon (SOC) protection layer with an average thickness of 300 nm was deposited by spin-on process. The global thickness variations along the whole wafer were $\Delta h_{protect\_global}=5$ nm. The planarization layer had a maximum measured height step $\Delta=28$ nm. Thus, the measured planarization efficiency PE according to the equation (3) was:

$$PE_{measured}=1-\tfrac{28}{57}=0.49=49\% \quad (16)$$

The etch selectivity of SOC to $SiO_2$ was $\xi 1=20$, using an oxygen plasma recipe to etch back the SOC (i.e., etch step 1). CF4/CHF3 mixture plasma recipe was used to etch back the silicon oxide hard mask, with the etch selectivity ξ2=4 (i.e., etch step 2). From formula (10) above, the minimum PE required for successful tone reversal with the above parameters is expressed as:

$$PE_{min} = 1/57(20/4+5+2) = 0.21 = 21\% \quad (17)$$

The measured planarization efficiency, $PE_{measured}=49\%$, which is significantly larger than the minimum planarization efficiency, $PE_{min}=21\%$, required for reverse tone processing:

$$PE_{measured} > PE_{min} \quad (18)$$

The observed planarization efficiency obtained by spin-on coating (49%) was enough to successfully reverse the whole pattern, including the small features (30 nm line/space) and large features (30 micron open areas).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
   forming a patterned layer on a substrate, the patterned layer defining a relief pattern having non-uniformly sized features;
   depositing a conformal hard mask layer by low temperature deposition over the patterned layer features;
   applying a non-planar protective layer over the conformal hard mask layer, the protective layer having a planarity efficiency PE of less than 95% (PE 95%);
   wherein the non-planar protective layer has a characteristic spatial parameter (sp), which is used for characterization of the planarity efficiency;
   wherein the protective layer has an etch selectivity ξ1 relative to the conformal hard mask layer of at least 5 (ξ1≥5) under first etch conditions;
   wherein the conformal hard mask layer has an etch selectivity ξ2 relative to the protective layer of greater than (ξ2>1) under second etch conditions;
   wherein the patterned layer has an etch selectivity ξ3 relative to the conformal hard mask layer of at least 5 (ξ3≥5) under third etch conditions;
   selectively etching the protective coating under the first etch conditions to expose the top surface of the conformal hard mask layer extending over the tops of the pattern protruded features;
   selectively etching the exposed conformal hard mask layer under the second etch conditions to expose the pattern features thereunder; and
   selectively etching the exposed pattern features under the third etch conditions to expose the substrate and form a pattern that is the reverse of the relief pattern;
   wherein the pattern includes a transition zone reverse tone feature in a transition zone and a small feature reverse tone feature in a small feature region;
   wherein small features in the small feature region have a lateral size (s), in at least one in-plane direction that are less than the characteristic spatial parameter (sp) (s<sp);
   wherein the transition zone is between a large feature and the small feature region;
   wherein the large feature is an open area that has two lateral sizes in-plane dimensions (s1 and s2) that are at least the characteristic spatial parameter (sp) (s1 and s2>sp);
   wherein a first region over the large feature of a top surface of the non-planar protective layer prior to being etched under the first etch conditions forms a depression relative to a second region over the small feature region of the top surface of the non-planar protective area prior to being etched under the first etch conditions; and
   wherein a transition zone critical dimension of a transition zone reverse tone feature is consistent with a small feature critical dimension of the small feature reverse tone feature.

2. The method of claim 1 wherein the non-planar protective coating has a planarity efficiency (PE) of at least 50% (50%≤PE<95%).

3. The method of claim 1 wherein the etch selectivity ξ2 is at least 2 (ξ2≥2) and the non-planar protective coating has a planarity efficiency (PE) of at least 35% (35%≤PE<95%).

4. The method of claim 3 wherein the planarity efficiency is less than 50%.

5. The method of claim 1 wherein the etch selectivity ξ2 is at least 5 (ξ2≥5) and the non-planar protective coating has a planarity efficiency (PE) of at least 20% (20%≤PE<95%).

6. The method of claim 5 wherein the planarity efficiency is less than 40%.

7. The method of claim 1 wherein the etch selectivity ξ2 is at least 10 (ξ2≥10) and the non-planar protective coating has a planarity efficiency (PE) of at least 15% (15%≤PE<95%).

8. The method of claim 7 wherein the planarity efficiency is less than 30%.

9. The method of claim 1 wherein the etch differential ξ2 is at least 20 (ξ2≥20) and the non-planar protective coating has a planarity efficiency (PE) of at least 10% (10%≤PE<95%).

10. The method of claim 1 wherein the planarity efficiency is less than 60%.

11. The method of claim 1 wherein etch selectivities ξ1 and ξ3 are maximized so as to obtain reverse tone features with minimized critical dimension variability.

12. The method of claim 1 wherein the conformal layer has a thickness $h_{HM}$ greater than one-half the space s between the closest features ($h_{HM} \geq s/2$).

13. The method of claim 1 wherein the patterned layer is formed by an imprint lithography process.

14. The method of claim 1 wherein the pattern comprises clusters of nanometer scaled features separated by micron-sized open areas.

15. The method of claim 1, wherein the transition zone reverse tone feature is the same size as the small feature reverse tone feature.

16. The method of claim 1, wherein the non-planar protective layer over the transition zone has a first planarization profile and the non-planar protective layer over the small feature region has a second planarization profile that is different from the first planarization profile.

17. A method of manufacturing an article comprising:
   forming a pattern on a substrate according to the method of claim 1;
   transferring the formed pattern into the substrate; and
   processing the substrate to manufacture the article.

18. The method of claim 17 wherein the article is a semiconductor device.

19. A method of forming a pattern with reverse tone features, wherein the reverse tone features include a small feature reverse tone feature and a transition zone reverse tone feature, the small feature reverse tone feature is in a small feature region, the transition zone reverse tone feature is in a transition zone, the transition zone is between a large feature and the small feature region, a transition zone critical dimension of a transition zone reverse tone feature is consistent with a small feature critical dimension of the small feature reverse tone feature, the method comprising:
  forming a patterned layer on a substrate, the patterned layer defining a relief pattern having non-uniformly sized features;
  depositing a conformal hard mask layer by low temperature deposition over the patterned layer features;
  applying a non-planar protective layer over the conformal layer, the protective layer having a planarity efficiency PE of less than 95% (PE 95%);
  the non-planar protective layer has a characteristic spatial parameter (sp), which is used for characterization of the planarity efficiency;
  wherein small features in the small feature region have a lateral size (s), in at least one in-plane direction that are less than the characteristic spatial parameter (sp) (s<sp);
  wherein the large feature is an open area that has two lateral sizes in-plane dimensions (s1 and s2) that are at least the characteristic spatial parameter (sp) (s1 and s2>sp);
  wherein the protective layer has an etch selectivity ξ1 relative to the conformal hard mask layer of at least 5 (ξ1≥5) under first etch conditions;
  wherein a first region over the large feature of a top surface of the non-planar protective layer prior to being etched under the first etch conditions forms a depression relative to a second region over the small feature region of the top surface of the non-planar protective area prior to being etched under the first etch conditions; and
  wherein the conformal hard mask layer has an etch selectivity ξ2 relative to the protective layer of greater than (ξ2>1) under second etch conditions;
  wherein the patterned layer has an etch selectivity ξ3 relative to the conformal hard mask layer of at least 5 (ξ3≥5) under third etch conditions;
  selectively etching the protective coating under the first etch conditions to expose the top surface of the conformal hard mask layer extending over the tops of the pattern protruded features;
  selectively etching the exposed conformal hard mask layer under the second etch conditions to expose the pattern features thereunder; and
  selectively etching the exposed pattern features under the third etch conditions to expose the substrate and forming the pattern with reverse tone features that is the reverse of the relief pattern.

20. A method of forming a pattern with reverse tone features, wherein the reverse tone features include a small feature reverse tone feature and a transition zone reverse tone feature, the small feature reverse tone feature is in a small feature region, the transition zone reverse tone feature is in a transition zone, the transition zone is between a large feature and the small feature region, a transition zone critical dimension of a transition zone reverse tone feature is consistent with a small feature critical dimension of the small feature reverse tone feature, the method comprising:
  forming a patterned layer on a substrate, the patterned layer defining a relief pattern having non-uniformly sized features;
  depositing a conformal hard mask layer by low temperature deposition over the patterned layer features;
  applying a non-planar protective layer over the conformal layer,
  wherein the non-planar protective layer over the transition zone has a first planarization profile and the non-planar protective layer over the small feature region has a second planarization profile that is different from the first planarization profile;
  wherein the non-planar protective layer has a characteristic spatial parameter (sp), which is used for characterization of the planarity efficiency of the non-planar protective layer;
  wherein small features in the small feature region have a lateral size (s), in at least one in-plane direction that are less than the characteristic spatial parameter (sp) (s<sp);
  wherein the large feature is an open area that has two lateral sizes in-plane dimensions (s1 and s2) that are at least the characteristic spatial parameter (sp) (s1 and s2>sp);
  wherein the protective layer has an etch selectivity ξ1 relative to the conformal hard mask layer under first etch conditions;
    wherein a first region over the large feature of a top surface of the non-planar protective layer prior to being etched under the first etch conditions forms a depression relative to a second region over the small feature region of the top surface of the non-planar protective area prior to being etched under the first etch conditions; and
  wherein the conformal hard mask layer has an etch selectivity ξ2 relative to the protective layer under second etch conditions;
  wherein the patterned layer has an etch selectivity ξ3 relative to the conformal hard mask layer under third etch conditions;
  selectively etching the protective coating under the first etch conditions to expose the top surface of the conformal hard mask layer extending over the tops of the pattern protruded features;
  selectively etching the exposed conformal hard mask layer under the second etch conditions to expose the pattern features thereunder; and
  selectively etching the exposed pattern features under the third etch conditions to expose the substrate and forming the pattern with reverse tone features that is the reverse of the relief pattern; and
  wherein the etch selectivity ξ1, the etch selectivity ξ2, and the etch selectivity ξ3 compensate for differences between the second planarization profile and the first planarization profile to ensure that the transition zone reverse tone feature is consistent with the small feature critical dimension.

* * * * *